United States Patent [19]
Weigand et al.

[11] Patent Number: 5,899,736
[45] Date of Patent: May 4, 1999

[54] TECHNIQUES FOR FORMING ELECTRICALLY BLOWABLE FUSES ON AN INTEGRATED CIRCUIT

[75] Inventors: Peter Weigand, Unterhaching, Germany; Dirk Tobben, Fishkill, N.Y.

[73] Assignee: Siemens Aktiengesellschaft, Munich, Germany

[21] Appl. No.: 08/933,955

[22] Filed: Sep. 19, 1997

[51] Int. Cl.$^6$ .................................................. H01L 29/00
[52] U.S. Cl. ........................................... 438/601; 438/467
[58] Field of Search .................................. 438/130–132, 438/467, 600–601

[56] References Cited

U.S. PATENT DOCUMENTS 5,675,174 10/1997 Nakajima et al. .
5,729,042 3/1998 Lou et al. .

Primary Examiner—Jey Tsai
Attorney, Agent, or Firm—Stanton C. Braden

[57] ABSTRACT

A method for fabricating an electrically blowable fuse on a semiconductor substrate. The method includes forming a fuse portion 102 on the semiconductor substrate. The fuse portion is configured to turn substantially non-conductive when a current exceeding a predefined current level passes through the fuse portion. The method also includes depositing a substantially conformal first layer 302 of dielectric material above the fuse portion and depositing a second layer 304 of dielectric material above the first layer, thereby forming a protrusion of dielectric material above the fuse portion. The second layer being different from the first layer. The method further includes performing chemical-mechanical polish on the protrusion to form an opening through the second layer above the protrusion. There is also included etching, in a substantially isotropic manner, a portion of the first layer through the opening to form a microcavity 502 about the fuse portion. The etching is substantially selective to the second layer and the fuse portion. Additionally, there is included depositing a substantially conformal third layer 606 of dielectric material above the second layer, thereby closing the opening in the second layer.

27 Claims, 3 Drawing Sheets

5,899,736

TECHNIQUES FOR FORMING ELECTRICALLY BLOWABLE FUSES ON AN INTEGRATED CIRCUIT

BACKGROUND OF THE INVENTION

The present invention relates to the fabrication of semiconductor devices. More particularly, the present invention relates to improved techniques for fabricating electrically blowable fuses on a semiconductor substrate.

Fuses have long been employed in integrated circuits. A fuse typically comprises a fuse portion formed of a fuse material that may be turned into a non-conductive state through various mechanisms. When the fuse is in its conductive state, an electrical current may pass through the fuse portion. When the fuse is blown, i.e., becomes non-conductive, an open circuit is created through which very little, if any, current may pass.

Exemplary uses of fuses include, for example, protecting sensitive portions of the integrated circuit during manufacturing to prevent a build up of charge from damaging the sensitive electronic devices thereon. After the integrated circuit is manufactured, the fuse may be blown to sever the current path, and the resulting IC may be employed as if the current path never existed. Fuses may also be employed to, for example, set the address bits of a redundant element in a dynamic random access memory (DRAM) array in order to specify to the decoding circuit the address of the defective main memory array element. With the address information furnished by the fuses, the redundant element may then be employed to replace the defective main memory array element.

Although there are many fuse designs today, two types of fuses have received wide acceptance: laser blowable fuses and electrically blowable fuses. With laser blowable fuses, the fuses are typically formed at or near the surface of the integrated circuit. A laser beam striking the fuse material renders the fuse portion non-conductive, thereby inhibiting current from flowing through. Although laser blowable fuses are relatively simple to fabricate, there are disadvantages. For example, the laser blowable fuses tend to be surface oriented, which places a limitation on the design of the IC. Further, laser blowable fuses tend to occupy a large amount of space on the IC surface since the adjacent fuses or devices must not be placed too close to the fuse or risk being inadvertently damaged by the laser beam during the fuse setting operation.

Electrically blowable fuses, on the other hand, do not have to be placed at or near the surface of the integrated circuit. Accordingly, they give the designers greater latitude in fuse placement. In general, they tend to be smaller than laser blowable fuses, which render them highly suitable for use in modern high density integrated circuits.

In a typically electrically blowable fuse, the fuse portion, typically formed of a material that changes its state from conductive to non-conductive when a current exceeding a predefined threshold is passed through, is typically disposed in a dielectric microcavity, i.e., a sealed, hollow chamber in a dielectric layer. The microcavity itself is typically formed in a multistep process, which conventionally requires one or more photolithography steps in the prior art.

To facilitate discussion, FIGS. 1 and 2 illustrate the prior art process for forming an electrically blowable fuse. Referring initially to FIG. 1, a fuse portion 102 is shown disposed on a substrate 104. Fuse portion 102 typically comprises a conductor made of a suitable fuse material such as doped polysilicon or metal. For reasons which will become apparent shortly, the fuse portion is typically capped with a silicon nitride layer.

As mentioned, fuse portion 102 is dimensioned and configured such that when a current exceeding a predefined current value passes through fuse portion 102, it changes to a non-conductive state to essentially inhibit current from subsequently flowing through. Substrate 104 typically represents an oxide layer and may include any other structures of the integrated circuit. By way of example and not by way of limitation, substrate 104 may represent a gate oxide or even any oxide layer above a shallow trench isolation (STI) area. Above fuse portion 102, another oxide layer 106 is conformally deposited. A silicon nitride layer 108 is then deposited above oxide layer 106.

Above silicon nitride layer 108, a photoresist layer 110 is deposited and patterned to form an opening 112. Patterned photoresist mask 110 is then employed to etch through silicon nitride layer 108 to expose a portion of oxide layer 106 above fuse portion 102. After an opening in silicon nitride layer 108 is formed, a subsequent isotropic etch is performed to create the microcavity. As is apparent, silicon nitride layer 108 acts as a hard mask during the isotropic etch of microcavity 202.

In FIG. 2, microcavity 202 has been isotropically etched out of oxide layer 106 through the opening in silicon nitride layer 108. The microcavity etch preferably employs an etch process that is selective both to the liner material of fuse portion 102 and silicon nitride layer 108.

Subsequent to the formation of microcavity 202, a plug layer 206, e.g., another oxide layer, is then deposited. The deposition process that forms plug layer 206 is such that the opening in the silicon nitride layer is sealed with the plug material while microcavity 202 is left hollow. Thus fuse portion 102 is essentially sealed within microcavity 202 after the deposition of plug layer 206. Accordingly, any particulate material that may be formed when fuse portion 102 is blown is kept contained within microcavity 202, thereby minimizing or essentially eliminating any possibility of particulate contamination of the IC surface.

It has been found, however, that the conventional process of forming electrically blowable fuse 100 has some disadvantages. In particular, the prior art technique of forming electrically blowable fuses requires at least one photolithography step to pattern a hard mask out of silicon nitride layer 108. As is known by those skilled in the art, photolithography is an expensive process and is therefore generally undesirable from a cost standpoint. Further, as the density of the integrated circuit increases and its feature sizes decrease, accurate alignment becomes problematic. By way of example, as fuse portion 102 decreases in width and the adjacent fuses and/or devices are packed closer together, the accurate alignment of opening 112 in photoresist layer 110 with fuse portion 102 becomes increasingly difficult. These and other challenges presented by the photolithography step render the fabrication of electrically blowable fuses 100 unduly expensive and, in many cases, even prohibitively expensive.

In view of the foregoing, there are desired improved techniques for fabricating electrically blowable fuses. In particular, there are desired improved techniques for forming electrically blowable fuses that do not require the use of a photolithography step to form a hard mask for the subsequent microcavity etch.

SUMMARY OF THE INVENTION

The invention relates, in one embodiment to a method for fabricating an electrically blowable fuse on a semiconductor substrate. The method includes forming a fuse portion on the semiconductor substrate. The fuse portion is configured to turn substantially non-conductive when a current exceeding a predefined current level passes through the fuse portion. The method also includes depositing a substantially conformal first layer of dielectric material above the fuse portion and depositing a second layer of dielectric material above the first layer, thereby forming a protrusion of dielectric material above the fuse portion. The second layer is different from the first layer.

The method further includes performing chemical-mechanical polish on the protrusion to form an opening through the second layer above the protrusion. There is also included etching, in a substantially isotropic manner, a portion of the first layer through the opening to form a microcavity about the fuse portion. The etching is substantially selective to the second layer and the fuse portion. Additionally, there is included depositing a substantially conformal third layer of dielectric material above the second layer, thereby closing the opening in the second layer.

In another embodiment, the invention relates to a method for fabricating an electrically blowable fuse on a semiconductor substrate. The method includes providing the substrate having thereon a protrusion of dielectric material comprising a first layer of dielectric material and a second layer of dielectric material above a fuse portion. The fuse portion is configured to change to a substantially non-conductive state when a first electrical current is passed through the fuse portion. The first layer represents a substantially conformal layer of first dielectric material above the fuse portion while the second layer represents a substantially conformal layer of second dielectric material above the first layer. The second dielectric material is different from the first dielectric material.

The method also includes performing chemical-mechanical polish on the protrusion to form an opening through the second layer above the protrusion, thereby exposing the second layer through the opening. The opening is configured to facilitate a subsequent etching of a portion of the first layer through the opening to form a microcavity about the fuse portion. The etching is substantially selective to the second layer and the fuse portion.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In one embodiment, there are provided techniques for forming electrically blowable fuses used in an ICs. Such IC includes a random access memory (RAM), a dynamic random access memory (DRAM), a synchronous DRAM (SDRAM), and a read only memory (ROM). Other types of ICs include application specific integrated circuits (ASICs) or any logic circuit. Typically, a plurality of ICs are formed on the wafer in parallel. After processing is finish, the wafer is diced to separate the ICs to individual chips. The chips are then packaged, resulting in a final product that is used in, for example, consumer products such as computer systems, cellular phones, personal digital assistants (PDAs), and other electronic products. The electrically blowable fuses are formed without requiring the use of a photolithography step to create a hard mask for the subsequent microcavity etch. In one embodiment, the opening in the hard mask is achieved by abrading or polishing through the hard mask layer using a relatively short chemical-mechanical polish (CMP) step.

The invention takes advantage of the intrinsic tendency of the CMP process for attacking isolated high spots on the substrate surface to solve the alignment problem, i.e., the alignment of the hard mask opening with the underlying fuse portion. It is advantageously recognized that since the high spots or protrusions are formed above the fuse portion through the use of conformal dielectric layer deposition, the CMP process automatically aligns the abraded spot, i.e., the opening in the vicinity of the high spot, with the underlying fuse portion. Once the opening is created, a subsequent microcavity etch may be employed to create the microcavity for the fuse.

Figure 1:
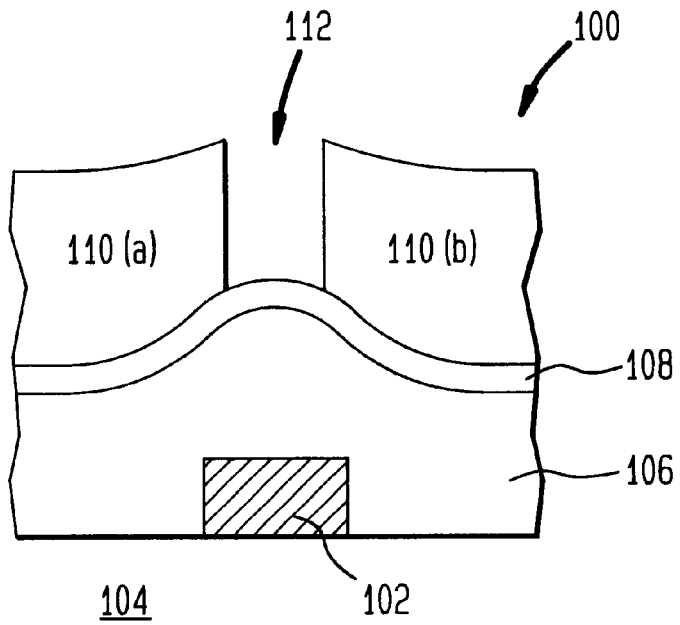
FIGS. 1 and 2 illustrate, to facilitate discussion, the conventional prior art technique for forming an electrically blowable fuse on an IC.
Figure 2:
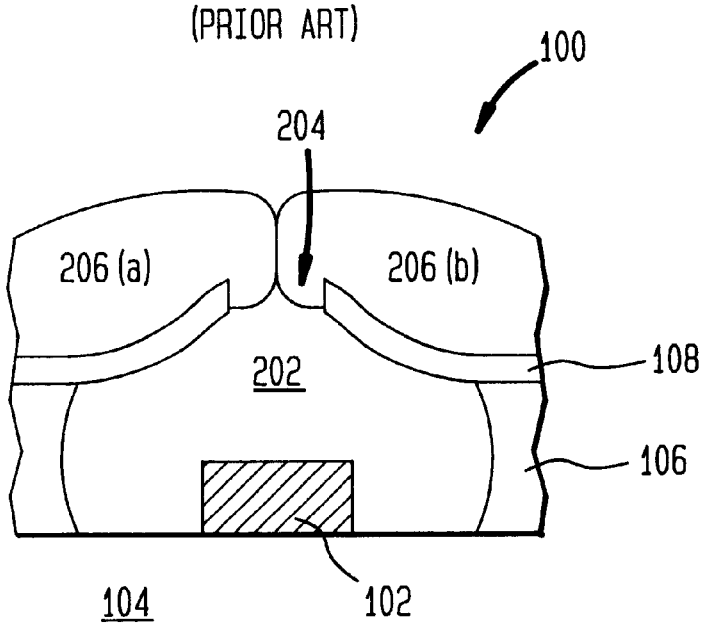

The features and advantages of the invention may be better understood with reference to the Figures that follow. FIGS. 3, 4, 5, and 6 illustrate, in accordance with one aspect of the present invention, the improved technique for forming electrically blowable fuses. As in FIGS. 1 and 2, a fuse portion 102 is again shown disposed above substrate 104 in FIG. 3. As mentioned earlier, fuse portion 102 preferably comprises a conductor formed of an appropriate fuse material such as polysilicon or metal. Polysilicon is preferred, in some applications, as the fuse material since it may offer a greater thermal budget. In one embodiment, fuse portion 102 may be employed to protect the gate structures of transistors and may therefore be formed from the same layers that are used to form the gates of transistors. In some of these applications, a layer of tungsten silicide or titanium silicide may cover the layer of fuse material. A silicon nitride liner may be provided to encapsulate and protect fuse portion 102 from being attacked in the subsequent microcavity etch. In one exemplary application, the fuse structure may be about 5,000–6,000 angstroms thick.

Above fuse portion 102 and substrate 104, a first dielectric layer 302 is conformally deposited. In one exemplary application, first dielectric layer 302 may be about 8,000–9,000 angstroms thick. First dielectric layer 302 may be formed of any suitable dielectric material that may be conformally deposited over fuse portion 102 and substrate 104. In one embodiment, first dielectric layer 302 represents a layer of borophosphosilicate (BPSG) glass. First dielectric layer 302 may also be a layer of phosphorous doped silicate glass (PSG) or phosphorous doped high density oxide (PHDP-oxide). First dielectric layer 302 may in fact be any doped oxide layer or any type of suitable conformal dielectric material. In one particularly advantageous embodiment, the first dielectric layer represents a layer of glass deposited by a conventional high density plasma process. As the term is employed herein, high density plasma deposition refers to the deposition of materials in a low pressure plasma CVD chamber that employs not only a source but also bias power to permit simultaneous deposition and sputtering. The high density plasma film conformally covers fuse portion 102 while substantially planarizing smaller, more tightly spaced features on the IC.

Above first dielectric layer 302, a second dielectric layer 304 is deposited. The thickness of the second dielectric layer is sufficient to serve as an etch mask for the subsequent etch that forms a microcavity within first dielectric layer 302. The thickness of the second dielectric layer 304 may be about 1,000 angstroms. The second dielectric layer 304 comprises a material that the first dielectric layer can be etched selectively thereto. That is, the etch effectively removes the first dielectric layer without removing the second dielectric layer. In one embodiment, the second dielectric layer 304 comprises silicon nitride. Other suitable dielectric material which the first dielectric layer can be etched selectively thereto may also be employed.

Figure 3:
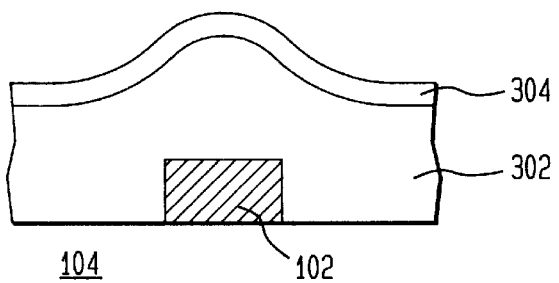
FIGS. 3, 4, 5, and 6 illustrate, in accordance with one aspect of the present invention, the improved technique for forming an electrically blowable fuse on an IC.

Illustratively, the second dielectric layer is conformally deposited over the first dielectric layer. As such, the topography of the underlying layer is reflected in the deposited layer, resulting in a protrusion on the surface of the substrate. Because of the underlying fuse portion, the protrusion is formed directly above fused portion 102, as shown in FIG. 3. A non-conformally deposited second dielectric layer is also useful. When a non-conformal layer is deposited, the topography of the underlying layer is not reflected therein.

Figure 4:
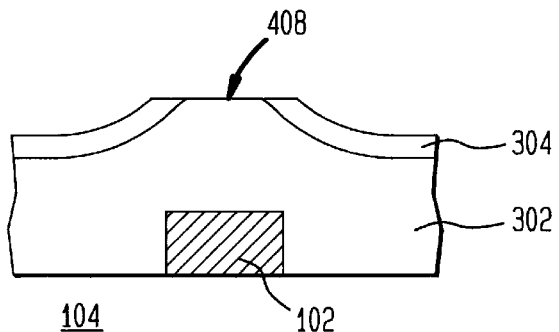

In FIG. 4, a chemical mechanical polish (CMP) step is employed to polish or abrade the protrusion above fuse portion 102 to break through second dielectric layer 304 and expose a portion of first dielectric layer 302 to the subsequent microcavity etch. The opening in second dielectric layer 304 is shown in FIG. 4 as opening 408. The invention employs, in one embodiment, the first dielectric layer 302 as a CMP stop layer. In other words, the CMP process stops as soon as or shortly after the underlying first dielectric layer 302 is exposed. In general, the CMP step may be relatively short, which tends to improve throughput, e.g. about 10–60 seconds in some cases. As can be appreciated by those skilled in the art, the CMP step is employed, in a nonobvious manner, in the formation of the hard mask that is employed to subsequently etch the microcavity in the first dielectric layer 302. In embodiments employing a non-conformal second dielectric layer, the CMP time may be increased since more material may need to be removed before exposing the underlying first dielectric layer.

Figure 5:
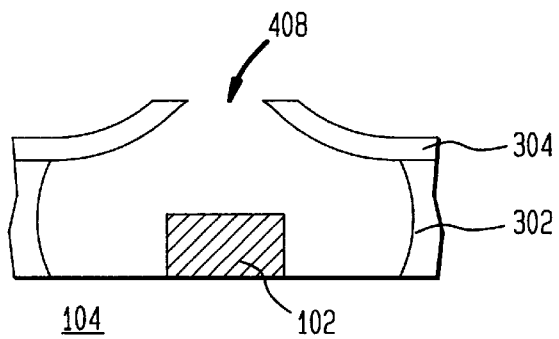

In FIG. 5, a microcavity has been etched in first dielectric layer 302 through opening 408 in hard mask/second dielectric layer 304. The microcavity etch step is preferably designed such that it does not unduly attack second dielectric layer 304 and fuse portion 102. As second dielectric layer 304 and the protective liner encapsulating fuse portion 102 are made of a silicon nitride material in one embodiment, the microcavity etch preferably employs an etchant that does not unduly attack silicon nitride. In one embodiment, an wet (e.g., isotropic) HF etch works well for a BPSG first dielectric layer 302. However, isotropic etching is not a requirement and etching may be performed in a somewhat anisotropic manner as long as such etching results in a microcavity that is capable of being subsequently sealed.

Figure 6:
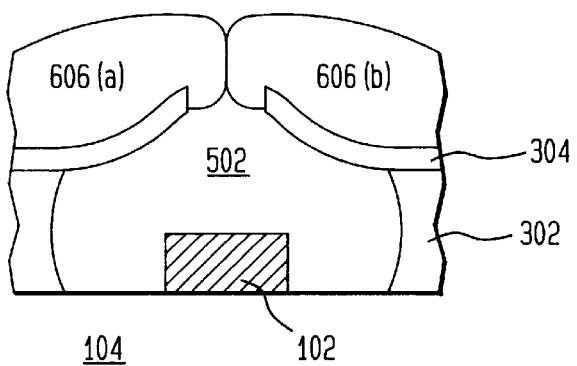

In FIG. 6, a third dielectric layer 606 is deposited above second dielectric layer 304. Third dielectric layer 606 may, for example, represent a low pressure chemical vapor deposition oxide layer (LPCVD) or LPCVD TEOS. Third dielectric layer 606 represents a plug dielectric layer, whose deposition process is configured to seal opening 408 in second dielectric layer 304 without filling microcavity 502 with dielectric material, thereby sealing microcavity 502 from the rest of the integrated circuit. When fuse portion 102 is blown, any particulate material that is generated is advantageously kept within microcavity 502, thereby minimizing or substantially eliminating particulate contamination problems during the fuse setting process.

Figure 7:
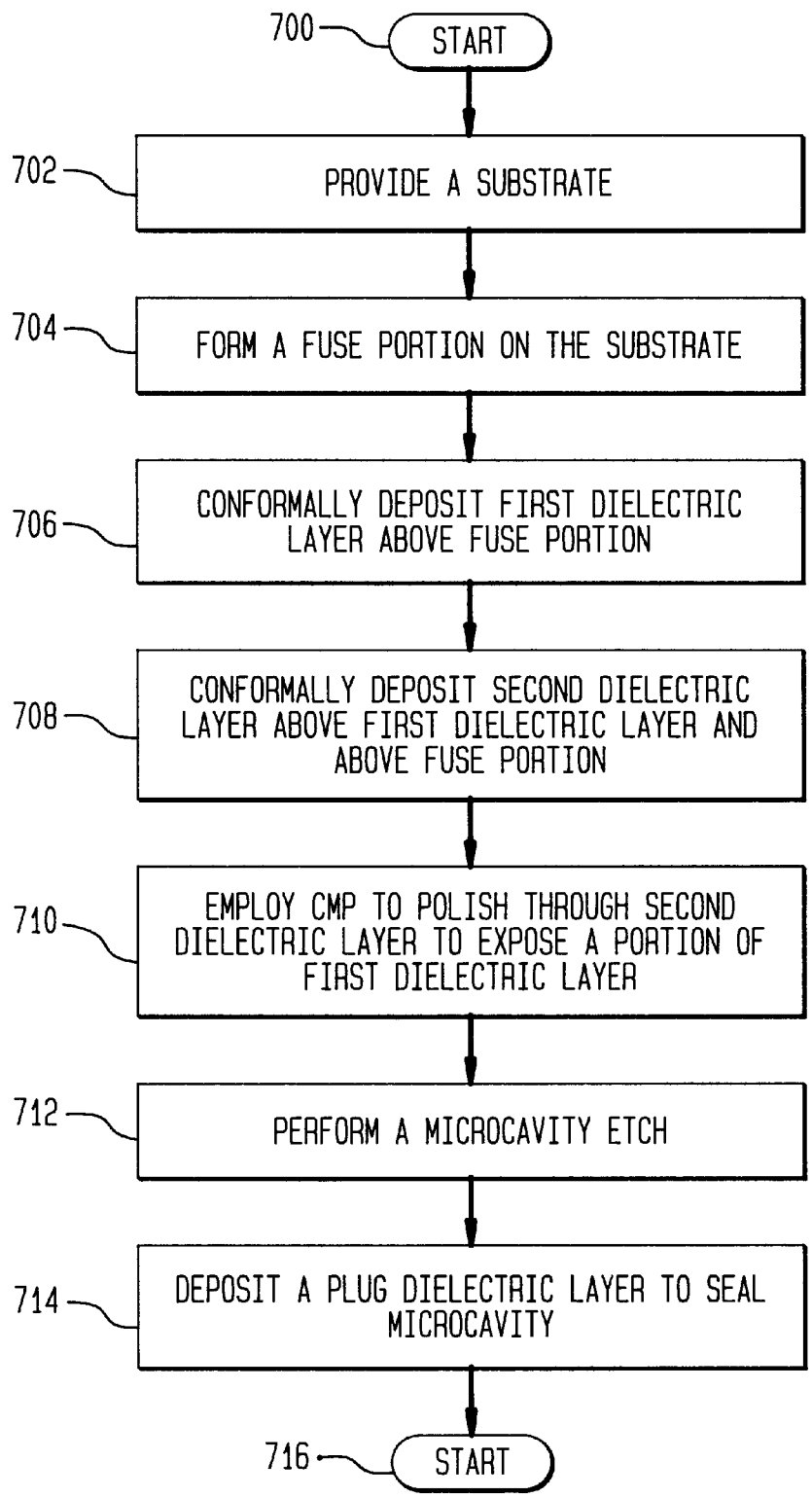
FIG. 7 illustrate, in accordance with one aspect of the present invention, the steps for forming the electrically blowable fuse of FIG. 6.

FIG. 7 illustrates, in accordance with one embodiment of the present invention, the steps employed in the formation of a typical electrically blowable fuse. In step 702, a substrate is provided. As mentioned, the substrate may represent a silicon substrate on which devices have already been formed. In step 704, a fuse portion, e.g., a conductor formed of a fuse material, is formed. In steps 706 and 708, the first and second dielectric layers are conformally deposited. In step 710, a CMP step is employed to polish through the second dielectric layer at the protruded spot to expose a portion of the underlying first dielectric layer. In step 712, a microcavity etch step is employed to etch a microcavity in the first dielectric layer through the opening in the hard mask/second dielectric layer while leaving the hard mask and the fuse portion substantially unetched. In step 714, a third dielectric layer representing a plug layer is deposited to close up the opening in the hard mask/second dielectric layer, thereby sealing the microcavity from the outside.

As can be appreciated from the foregoing, the photolithography step employed in the prior art to form a hard mask out of second dielectric layer 304 has been eliminated. Accordingly, the high cost and alignment problems associated with the photolithography step are also advantageously eliminated. In a nonobvious manner, the present invention employs chemical mechanical polish (CMP) as a mask forming technique. The use of CMP as a mask forming technique is nonobvious since CMP is typically regarded as a planarizing step, i.e., not as a step to form selective, aligned openings in a layer. Further, it would be nonobvious to employ CMP to form a hard mask since CMP is generally not favored by process engineers since the CMP material removal depth tends to be difficult to control and scratches may form on the substrate if the CMP process is not carefully designed. The use of a CMP step is also nonobvious since CMP tends to generate particulate matter (in the form of a slurry), which requires subsequent cleaning steps and is therefore generally undesired by process engineers. Further, most fabrication facilities do not have CMP tools. Accordingly, most process engineers would not naturally think of CMN as a process to create a hard mask.

Further, the invention takes advantage of the intrinsic nature of the CMP process to attack high spots or protrusions on the substrate surface to automatically align the opening of the hard mask with the underlying fuse portion. Because of this, microcavity 502 is correctly positioned about fuse portion 102 in a subsequent microcavity etch step.

In accordance with another aspect of the present invention, the CMP step may be performed using a soft pad, i.e., a pad that can locally "adapt" to the underlying topography to ensure that the CMP step removes only the protrusions or high spots above the fuse portions without inadvertently removing the dielectric material from other raised portions of the integrated circuit. Alternatively or additionally, supplemental design rules may be specified to prevent the inadvertent removal of the dielectric material from other raised portions of the integrated circuit. To ensure protection of raised areas where CMP removal is not desired, the electrically blowable fuses may be positioned away from other structures of the IC. Alternatively or additionally, dummy structures may be put around structures which need to be protected from CMP. These additional dummy structures form raised plateaus instead of isolated raised protrusions or high spots, which tend to be more readily attacked by the CMP process.

While this invention has been described in terms of several preferred embodiments, there are alterations, permutations, and equivalents which fall within the scope of this invention. By way of example, although the disclosures refers mainly to DRAMS, the fuses formed in accordance with the techniques disclosed herein may be employed in any fuse application on any type of IC, e.g., to protect sensitive components and/or provide binary values. It is therefore intended that the following appended claims be interpreted as including all such alterations, permutations, and equivalents as fall within the true spirit and scope of the present invention.

What is claimed is:

1. A method for fabricating an electrically blowable fuse on a semiconductor substrate, comprising:

forming a fuse portion on said semiconductor substrate, said fuse portion being configured to turn substantially non-conductive when a current exceeding a predefined current level passes through said fuse portion;

depositing a substantially conformal first layer of dielectric material above said fuse portion;

depositing a second layer of dielectric material above said first layer, said second layer being different from said first layer, thereby forming a protrusion of dielectric material above said fuse portion;

performing chemical-mechanical polish on said protrusion to form an opening through said second layer above said protrusion;

etching, in a substantially isotropic manner, a portion of said first layer through said opening to form a microcavity about said fuse portion, said etching being substantially selective to said second layer and said fuse portion; and depositing a substantially conformal third layer of dielectric material above said second layer, thereby closing said opening in said second layer.

2. The method of claim 1 wherein said fuse portion includes a polysilicon conductor.

3. The method of claim 1 wherein said fuse portion includes a metallic conductor.

4. The method of claim 1 wherein said first layer represents a silicon oxide layer and said second layer represents a silicon nitride layer.

5. The method of claim 1 wherein said first layer represents a silicon oxide layer and said second layer represents a silicon nitride layer.

6. The method of claim 1 wherein said first layer represents a doped oxide layer, said second layer represents a silicon nitride layer.

7. The method of claim 1 wherein said first layer represents a phosphorous doped silicate glass (PSG) layer, said second layer represents a silicon nitride layer.

8. The method of claim 1 wherein said first layer represents a BPSG layer, said second layer represents a silicon nitride layer.

9. The method of claim 8 wherein said first layer is deposited by a high density plasma chemical vapor deposition process.

10. The method of claim 9 wherein said performing chemical-mechanical polish employs a soft pad.

11. The method of claim 1 wherein said fuse portion includes a polysilicon conductor covered with a silicon nitride liner.

12. The method of claim 1 wherein said semiconductor substrate represents a substrate employed to manufacture dynamic random access memory (DRAM) circuits.

13. A method for fabricating an electrically blowable fuse on a semiconductor substrate, comprising:

forming a fuse portion on said semiconductor substrate, said fuse portion being configured to turn substantially non-conductive state when a first electrical current exceeding a predefined current level is passed through said fuse portion;

depositing a substantially conformal first layer of dielectric material above said fuse portion;

depositing a substantially conformal second layer of dielectric material above said first layer, said second layer being different from said first layer, thereby forming a protrusion of dielectric material comprising said first layer and said second layer above said fuse portion;

performing chemical-mechanical polish on said protrusion to form an opening through said second layer above said protrusion, thereby exposing said second layer through said opening;

etching a portion of said first layer through said opening to form a microcavity about said fuse portion, said etching being substantially selective to said second layer and said fuse portion; and depositing a substantially conformal third layer of dielectric material above said second layer, thereby sealing said microcavity.

14. The method of claim 13 wherein said fuse portion includes a polysilicon conductor.

15. The method of claim 13 wherein said fuse portion includes a metallic conductor.

16. The method of claim 13 wherein said first layer represents a silicon oxide layer and said second layer represents a silicon nitride layer.

17. The method of claim 13 wherein said first layer represents a silicon oxide layer and said second layer represents a silicon nitride layer.

18. The method of claim 13 wherein said first layer represents a BPSG layer, said second layer represents a silicon nitride layer.

19. The method of claim 18 wherein said first layer is deposited by a high density plasma chemical vapor deposition process.

20. The method of claim 19 wherein said performing chemical-mechanical polish employs a soft pad.

21. The method of claim 13 wherein said etching is performed in a substantially isotropic manner.

22. The method of claim 13 wherein said semiconductor substrate represents a substrate employed to manufacture dynamic random access memory (DRAM) circuits.

23. A method for fabricating an electrically blowable fuse on a semiconductor substrate, comprising:

providing said substrate having thereon a protrusion of dielectric material comprising a first layer of dielectric material and a second layer of dielectric material above a fuse portion, said fuse portion being configured to change to a substantially non-conductive state when a first electrical current is passed through said fuse portion, said first layer representing a substantially conformal layer of first dielectric material above said fuse portion, said second layer representing a substantially conformal layer of second dielectric material above said first layer, said second dielectric material being different from said first dielectric material; and performing chemical-mechanical polish on said protrusion to form an opening through said second layer above said protrusion, thereby exposing said second layer through said opening, said opening being configured to facilitate a subsequent etching of a portion of said first layer through said opening to form a microcavity about said fuse portion, said etching being substantially selective to said second layer and said fuse portion.

24. The method of claim 23 further comprising:

performing said etching through said opening to form said microcavity.

25. The method of claim 24 further comprising:

depositing a substantially conformal third layer of dielectric material above said second layer, thereby substantially sealing said fuse portion within said microcavity.

26. The method of claim 24 wherein said first layer represents a silicon oxide layer and said second layer represents a silicon nitride layer.

27. The method of claim 23 wherein said semiconductor substrate represents a substrate employed to manufacture dynamic random access memory (DRAM) circuits.

* * * * *